(12) United States Patent
Chowdhury et al.

(10) Patent No.: US 11,411,390 B2
(45) Date of Patent: Aug. 9, 2022

(54) SECURE AND DEPENDABLE RESTRICTED EARTH FAULT PROTECTION FOR ELECTRIC POWER GENERATORS AND TRANSFORMERS

(71) Applicant: Schweitzer Engineering Laboratories, Inc., Pullman, WA (US)

(72) Inventors: Ritwik Chowdhury, Charlotte, NC (US); Matchyaraju Alla, Pullman, WA (US); Satish Samineni, Malvern, PA (US); Normann Fischer, Colfax, WA (US); Dale S. Finney, Little Bras d'Or (CA)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 39 days.

(21) Appl. No.: 17/139,393

(22) Filed: Dec. 31, 2020

(65) Prior Publication Data

US 2022/0209525 A1 Jun. 30, 2022

(51) Int. Cl.
*H02H 7/045* (2006.01)
*H02H 3/16* (2006.01)
(Continued)

(52) U.S. Cl.
CPC ............ *H02H 7/045* (2013.01); *G01R 31/08* (2013.01); *H02H 3/16* (2013.01); *H02H 3/20* (2013.01); *H02H 7/26* (2013.01)

(58) Field of Classification Search
CPC ............ H02H 7/045; H02H 3/16; H02H 3/00; H02H 7/26; H02H 1/00; H02H 1/0007;
(Continued)

(56) References Cited

U.S. PATENT DOCUMENTS 4,204,237 A 5/1980 Zocholl
5,115,226 A 5/1992 Schweitzer
(Continued)

FOREIGN PATENT DOCUMENTS

GB 2362275 11/2001
WO 2005064759 7/2005

OTHER PUBLICATIONS

Normann Fischer, Derrick Haas, and David Costello, "Analysis of an Autotransformer Restricted Earth Fault Application" Originally presented at the 34th Annual Western Protective Relay Conference, Oct. 2007.

*Primary Examiner* — Danny Nguyen
(74) *Attorney, Agent, or Firm* — Richard M. Edge

(57) ABSTRACT

Detection of, and protection against faults within a restricted earth fault (REF) zone of a transformer or a generator is disclosed herein. Security of the REF protection element uses comparison of a negative-sequence reference quantity. The REF condition is only detected when there is sufficient ground involvement and a fault in the reverse detection has not been detected. Dependability of the REF protection element in low-impedance grounded systems is improved by ensuring that the element operates when a zero-sequence reference quantity and a neutral operate quantity are orthogonal to each other. The REF protection element further determines an open CT condition and blocks detection of an REF fault upon determination of the open CT condition. A tripping subsystem may issue a trip command based upon detection of the REF condition.

20 Claims, 8 Drawing Sheets

(51) Int. Cl.
*G01R 31/08* (2020.01)
*H02H 3/20* (2006.01)
*H02H 7/26* (2006.01)

(58) Field of Classification Search
CPC ... H02H 3/20; H02H 3/26; H02H 7/04; G01R 31/08
USPC ..................................................... 361/62–69
See application file for complete search history.

(56) References Cited

U.S. PATENT DOCUMENTS

| | | | |
|---|---|---|---|
| 5,367,426 A | 11/1994 | Schweitzer, III | |
| 5,602,707 A | 2/1997 | Schweitzer | |
| 5,703,745 A | 12/1997 | Roberts | |
| 5,963,404 A | 10/1999 | Guzman-Casillas | |
| 6,011,480 A | 1/2000 | Schweitzer | |
| 6,148,267 A | 11/2000 | Premerlani | |
| 6,256,592 B1 | 7/2001 | Roberts | |
| 6,341,055 B1 | 1/2002 | Guzman-Casillas | |
| 6,356,421 B1 | 3/2002 | Guzman-Casillas | |
| 6,411,865 B1 | 6/2002 | Qin | |
| 6,456,947 B1 | 9/2002 | Adamiak | |
| 6,518,767 B1 | 2/2003 | Roberts | |
| 6,525,543 B1 | 2/2003 | Roberts | |
| 6,573,726 B1 | 6/2003 | Roberts | |
| 6,590,397 B2 | 7/2003 | Roberts | |
| 6,670,721 B2 | 12/2003 | Lof | |
| 6,721,671 B2 | 4/2004 | Roberts | |
| 6,785,105 B2 | 8/2004 | Roberts | |
| 6,841,976 B1 | 1/2005 | Sen | |
| 6,879,917 B2 | 4/2005 | Turner | |
| 7,196,884 B2 | 3/2007 | Guzman-Casillas | |
| 7,279,905 B2 | 10/2007 | Cvorovic | |
| 7,319,576 B2 | 1/2008 | Thompson | |
| 7,345,863 B2 | 3/2008 | Fischer | |
| 7,400,150 B2 | 7/2008 | Cannon | |
| 7,425,778 B2 | 9/2008 | Labuschagne | |
| 7,472,026 B2 | 12/2008 | Premerlani | |
| 7,812,615 B2 | 10/2010 | Gajic | |
| 8,717,725 B2 | 5/2014 | Labuschagne | |
| 10,819,261 B1 * | 10/2020 | Chowdhury | H02H 7/06 |
| 2004/0021995 A1 | 2/2004 | Roberts | |
| 2007/0021937 A1 | 1/2007 | Labuschagne | |
| 2007/0035902 A1 | 2/2007 | Schweitzer | |
| 2007/0070565 A1 | 3/2007 | Benmouyal | |
| 2008/0088466 A1 | 4/2008 | Labuschagne | |
| 2008/0130179 A1 | 6/2008 | Gajic | |
| 2009/0091867 A1 | 4/2009 | Guzman-Casillas | |
| 2012/0140365 A1 * | 6/2012 | Labuschagne | H02H 3/16 361/47 |

* cited by examiner

SECURE AND DEPENDABLE RESTRICTED EARTH FAULT PROTECTION FOR ELECTRIC POWER GENERATORS AND TRANSFORMERS

RELATED APPLICATIONS

[none]

TECHNICAL FIELD

This disclosure relates to the secure and dependable detection of internal faults on electric power delivery system equipment. More particularly, this disclosure relates to the secure protection element performance for external faults and dependable detection of internal faults when applied to low-impedance grounded systems.

BRIEF DESCRIPTION OF THE DRAWINGS

Non-limiting and non-exhaustive embodiments of the disclosure are described, including various embodiments of the disclosure with reference to the figures, in which.

Figure 1:
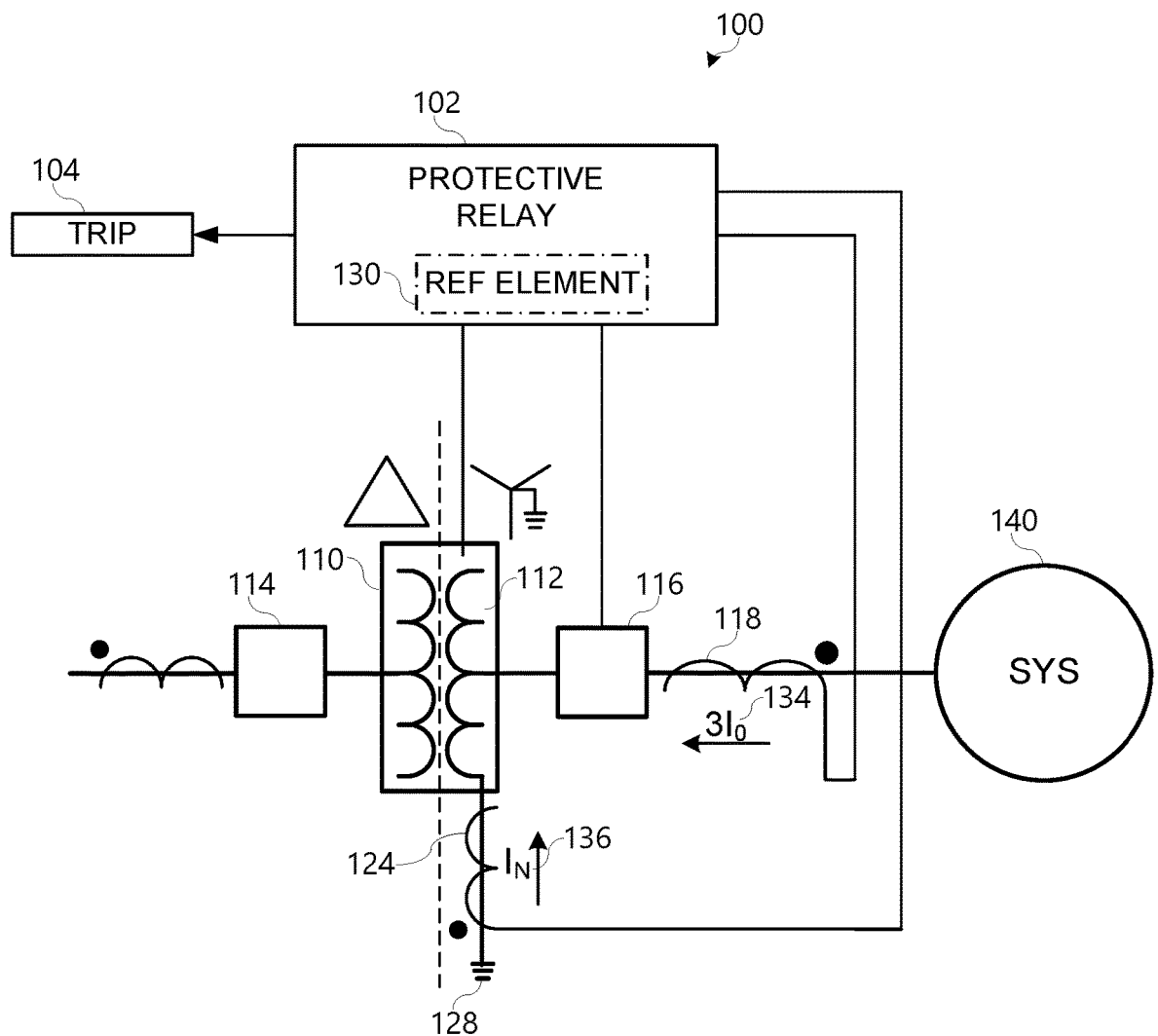
FIG. 1 illustrates a simplified block diagram of an electric power delivery system transformer with restricted earth fault protection in accordance with various embodiments herein.

In the following description, numerous specific details are provided for a thorough understanding of the various embodiments disclosed herein. However, those skilled in the art will recognize that the systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

Electric power delivery systems are used to transmit power from sources to loads, and include various kinds of equipment to facilitate transmission. Generators play the important role of generating the electric power that is transmitted, distributed, and consumed using the electric power delivery system. Generators may be embodied in many different forms and may be in electrical connection with the electric power delivery system in different ways. Transformers are used to transfer electric power from a system at a first voltage to another system at a second voltage. For example, transformers may be used to transform power at generation voltage levels to power at transmission voltage levels; and other transformers may transform power at transmission voltage levels to lower distribution voltage levels. In AC electric power delivery, transformers may be multi-phase, and are critical pieces of equipment for the reliable delivery of power. In order to maintain the health of electric power transformers, IEDs are often used to detect conditions of the electric power equipment such as transformers and generators, and take protective actions such as opening circuit breakers to remove the electric power transformer from service. Electric faults between windings, or between windings and ground must be securely and quickly detected so that power may be removed before the transformer is damaged. It should be noted that although many embodiments herein are described as the monitoring and protection of electric power transformers, certain embodiments may also apply to other electric power system equipment such as electric power generators.

To properly isolate a fault, and maintain reliable delivery of electric power, IEDs must differentiate between faults external to the transformer, and internal faults. Restricted earth fault (REF) protection uses ground current in the transformer neutral and zero-sequence current at the terminals. REF protection is adequate for many conditions because it does not respond to load current. However, it lacks security under certain conditions such as CT saturation for an external fault. Furthermore, typical REF protection may not detect certain faults for resistive grounded transformers, or where external fault detection is used to block REF in an effort to increase security.

What is needed is restricted earth fault protection that is secure, dependable, and retains speed. Disclosed herein are systems and methods for securely detecting an internal fault on a transformer.

Reference throughout this specification to "one embodiment" or "an embodiment" indicates that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. In particular, an "embodiment" may be a system, an article of manufacture (such as a computer readable storage medium), a method, and/or a product of a process.

The phrases "connected to," "networked," and "in communication with" refer to any form of interaction between two or more entities, including mechanical, electrical, magnetic, and electromagnetic interaction. Two components may be connected to each other, even though they are not in direct physical contact with each other and even though there may be intermediary devices between the two components. A computer may include a processor such as a microprocessor, microcontroller, logic circuitry, or the like. The processor may include a special purpose processing device such as an ASIC, PAL, PLA, PLD, Field Programmable Gate Array, or other customized or programmable device. The computer may also include a computer readable storage device such as: non-volatile memory, static RAM, dynamic RAM, ROM, CD-ROM, disk, tape, magnetic, optical, flash memory, or other computer readable storage medium.

The described features, operations, or characteristics may be combined in any suitable manner in one or more embodiments. It will also be readily understood that the order of the steps or actions of the methods described in connection with the embodiments disclosed herein may be changed, as would be apparent to those skilled in the art. Thus, any order in the drawings or detailed description is for illustrative purposes only and is not meant to imply a required order, unless specified to require an order. In the following description, numerous details are provided to give a thorough understanding of various embodiments. One skilled in the relevant art will recognize, however, that the embodiments disclosed herein can be practiced without one or more of the specific details, or with other methods, components, materials, etc. In other instances, well-known structures, materials, or operations are not shown or described in detail to avoid obscuring aspects of this disclosure.

FIG. 1 illustrates a block diagram of a transformer 110 of an electric power delivery system that includes REF protection. The transformer includes windings 112 connected in a delta-wye configuration. Circuit breakers 114 and 116 may be used to disconnect the transformer from the source side and/or the system 140 side of the transformer 110. As illustrated, the REF protection in the transformer system is restricted to a zone between the three-phase current transformer 118 and the neutral-current transformer 124 that are connected to the wye winding of the transformer 110. In particular, the three-phase current transformer 118 and the neutral-current transformer 124 are wired to cancel current during external faults outside of the REF protection zone, and drive secondary current to an REF element 130 when the fault is inside of the REF protection zone. Although illustrated as single lines and single transformers, the electric power delivery system may be three-phase; and the three-phase current transformer 118 may consist of three sets of primary and secondary winding (i.e. three single-phase current transformers). The neutral-current transformer 124 may be connected between the neutral point of winding 112 and ground 128.

The REF element 130 may be embodied as a module in an IED such as protective relay 102. The protective relay 102 may receive the current signals from the three-phase current transformer 118 and the neutral-current transformer 124, and perform various functions such as REF protection using such currents.

A traditional REF element would use terminal current signals $3I_0$ 134 obtained using the current transformer 118 and neutral current signals $I_N$ 136. Specifically, the terminal current signals would be zero-sequence current $3I_0$ signals summed in a manner such that faults external to the restricted zone would be canceled (and as such, the REF relay would not operate for such external faults), but would pick up for faults internal to the restricted zone.

If a fault is present in the wye windings 112, the sum of the zero-sequence three-phase current $3I_0$ 134 and the neutral current $I_N$ 136 is not zero. For example, if an internal ground fault occurs at circuit breaker 116, then the system 140 may contribute some zero-sequence current measured by the three-phase current transformer 118. The zero-sequence current measured by the three-phase current transformer 118, however may not be the same amount of current measured by the neutral-current transformer 124 (i.e., neutral current 136 $I_N$). As such, the sum of the three-phase current $3I_0$ 134 and the neutral current 136 is not zero, thereby indicating that a fault condition may be present within the restricted zone.

The current signals $3I_0$ 134 and $I_N$ 136 from the current transformers may be obtained by the protective relay 102 and used by the REF element 130. Upon detection of an anomalous condition, the protective relay 102 may issue an alarm and/or a trip command 104 to open the circuit breaker 116, and to electrically remove the transformer 110 from the system 140. For example, upon detection of a fault condition, the protective relay 102 may send a trip command 104 to the circuit breaker 116 to trip (i.e., switch to open) and disconnect the transformer 110 from the system 140 in order to protect the transformer 110 and/or the system 140 from damage that may otherwise occur due to the fault. Additionally, or alternatively, the protective relay 102 may send an alarm signal to indicate that a fault exists.

Although not shown in FIG. 1, the protective relay 102 may include a microprocessor, a non-volatile memory, and/or a user interface. The microprocessor may include any type of processing circuitry, such as one or more processors, general-purpose microprocessors, special-purpose microprocessors, application-specific integrated circuits (ASICs), or some combination thereof. For example, the microprocessor may include one or more reduced instruction set (RISC) processors. The processor may process instructions stored in the memory to determine operations and faults, as will be discussed in detail herein. Moreover, the processor may process the instructions to command components to operate equipment such as the circuit breakers 114, 116 based on determined faults, and so forth.

The memory may be configured to store instructions, data, and/or information, such as an algorithm used for determining internal or external ground faults based on stored data (e.g., predetermined current thresholds) and/or received data (e.g., three-phase current 134 and neutral current 136). The memory may be a tangible, non-transitory, computer-readable medium that stores sensor data and/or instructions executable by the processor. Thus, in some embodiments, the memory may include random access memory (RAM), read-only memory (ROM), rewritable non-volatile memory, flash memory, hard drives, optical discs, and the like.

Furthermore, in some embodiments, the protective relay 102 may be communicatively coupled to and/or include a user interface that provides information to and/or receives information from a user. In some embodiments, the user may control or override the protective relay 102, such as to manually command a maintenance operation or a mitigating operation to prevent potential damage that may occur in the transformer 110 due to a fault. The user interface may include any suitable combination of input and output devices, such as an electronic display, a touchscreen, stylus, keypad, button, and/or the like, to enable communicating system fault and/or system information to a user. Moreover, in some embodiments, the protective relay 102 may be communicatively coupled to and/or include a communication interface that may enable communication with any suitable communication network, such as wiring terminals, a cellular network, WiFi network a personal area network (PAN), local area network (LAN), wide-area network (WAN), or the like. For example, the communication interface may enable the controller 102 to communicate with a user interface implemented on a user's mobile device, which may also be communicatively coupled to the communication network.

Although briefly mentioned above, the REF monitoring and protection described herein may be applied to a generator as well as to a transformer. In instances where a generator is monitored and protected, the transformer 110 of FIG. 1 is simply replaced with a generator, where the CT 118 is in electrical communication with the terminals of the generator, and the neutral grounding CT 124 is in electrical communication with a neutral ground connection of the generator.

Figure 2:
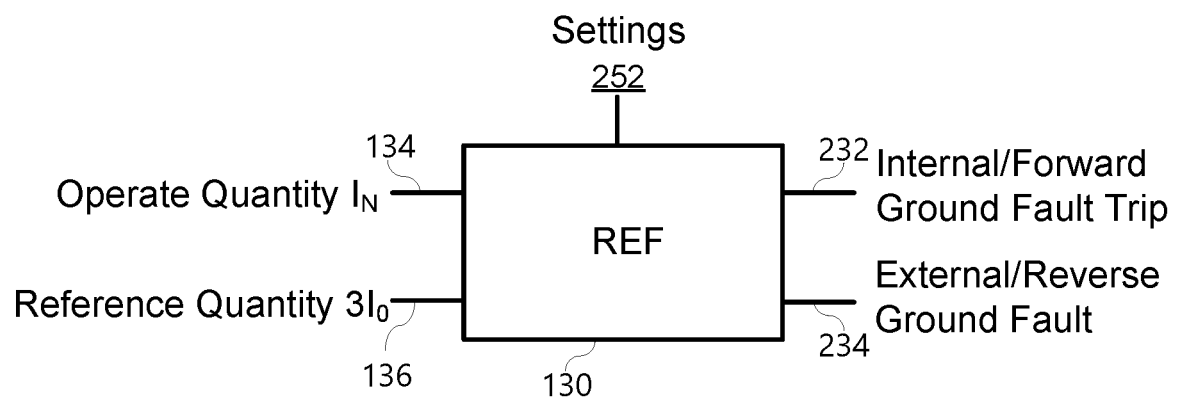
FIG. 2 illustrates a block diagram of a restricted earth fault element used to determine internal and external ground faults.

FIG. 2 illustrates a block diagram of an implementation of an REF element 130 to determine internal and external faults. Inputs to the REF element 130 may include the zero-sequence current $3I_0$ 134 as a reference quantity and the neutral current $I_N$ 136 as an operate quantity. The REF element 130 may operate in accordance with user settings 252 stored at commissioning or setting of the REF element 130. Generally, a torque may be calculated from the reference quantity 134 and the operate quantity 136. The torque may be compared with a threshold, to determine whether the detected fault is internal or external. The REF element 130 asserts an internal fault signal 232 or an external fault signal 234 depending on the comparison of the torque and threshold. As mentioned above, traditional REF relay implementations may suffer from a lack of security or dependability. In various implementations, to correct for a lack of security, the REF relay implementation may sacrifice dependability. The systems and methods described herein improve both security and dependability of REF protection without sacrificing speed. Briefly, the systems and methods described herein use negative-sequence current from the terminals as well as zero-sequence current from the terminals to detect a phase fault hence securing the REF element 130 for external faults without adding delay timers to verify internal faults. In certain embodiments, the REF element is designed such that for a low-resistance grounded system, dependability is improved when the neutral fault current is resistive and the terminal zero-sequence current is inductive or capacitive. In certain embodiments, the REF element may be disabled upon detection of an open CT condition, adding further security.

Figure 3:
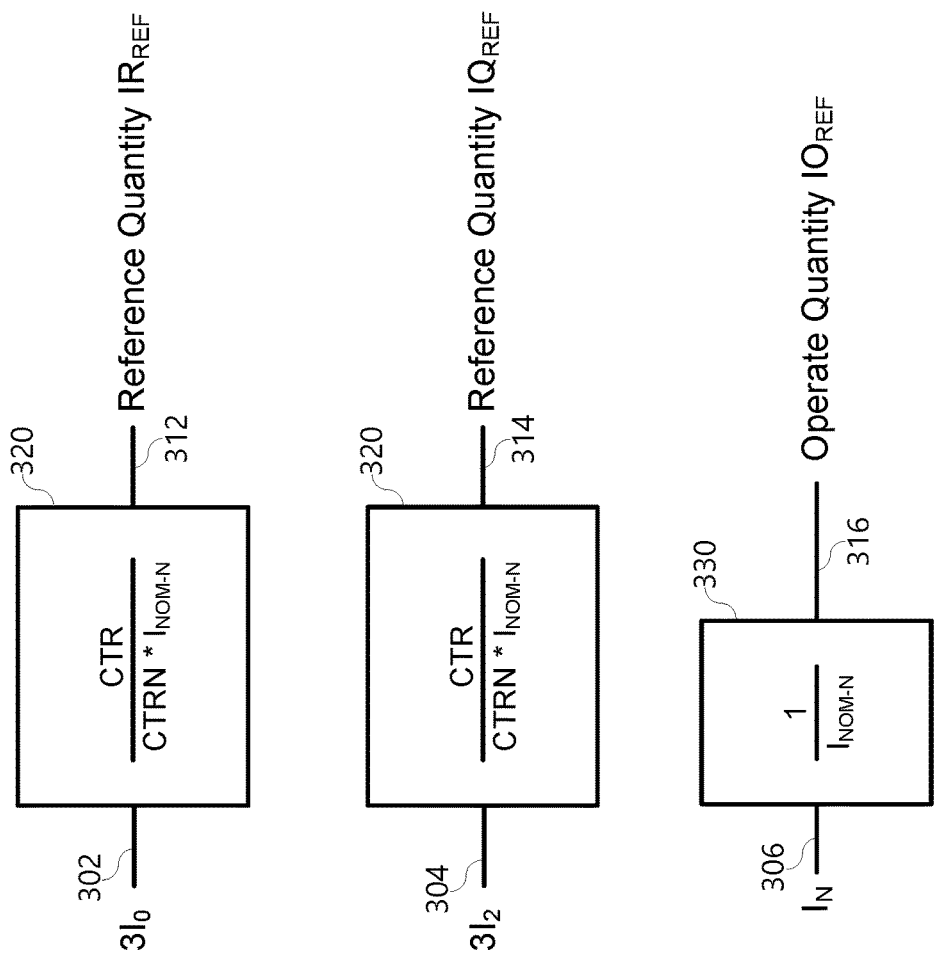
FIG. 3 illustrates a block diagram for determining reference and operating quantities in accordance with several embodiments herein.

FIG. 3 illustrates a simplified logic diagram for the calculation of reference and operate quantities that may be used for REF protection in accordance with several embodiments herein. In particular, a zero-sequence reference quantity $IR_{REF}$ 312 may be determined by normalizing a zero-sequence current $3I_0$ signal 302 obtained from the terminals. Block 320 may normalize the zero-sequence current $3I_0$ 302 using the CT ratio CTR of the terminal current transformer 118, the CT ratio CTRN of the neutral current transformer 124 and the nominal neutral input current $I_{NOM-N}$. Similarly, the negative-sequence reference current quantity $IQ_{REF}$ 314 may be calculated by normalizing the negative sequence current $3I_2$ 304 obtained from the terminal current transformer 118. Other normalizing factors may be selected and used.

The operate quantity $IO_{REF}$ 316 may calculated by normalizing the neutral-ground current IN 306, obtained using current transformer 124. The normalization 330 may use the nominal neutral input current $I_{NOM-N}$.

With the reference quantities $IR_{REF}$ 312 and $IQ_{REF}$ 314 and the operate quantity $IO_{REF}$ 316, the methods and systems herein may determine whether a fault condition exists, and whether the fault condition is internal to the restricted earth fault zone or external to the restricted earth fault zone.

Figure 4:
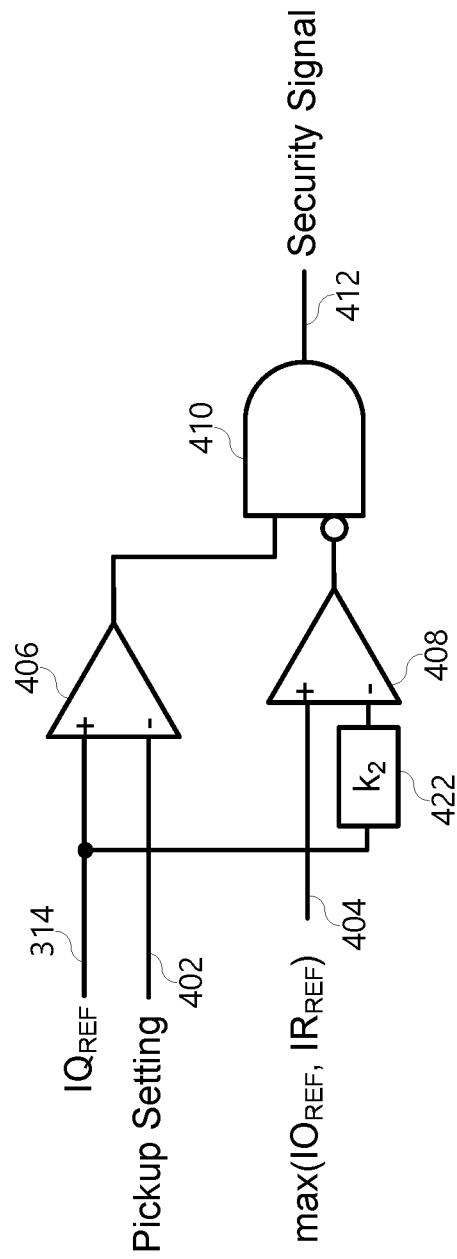
FIG. 4 illustrates a logic diagram for detection of a phase fault using the reference and operating quantities in accordance with several embodiments herein.

FIG. 4 illustrates a logic diagram for detecting a phase fault using the negative-sequence reference quantity $IQ_{REF}$ 314, the operate quantity $IO_{REF}$ 316, and the zero-sequence reference quantity $IR_{REF}$ 312. In particular, the negative-sequence reference quantity $IQ_{REF}$ 314 is compared with a pickup setting 402 in comparator 406. The pickup setting 402 may be in per-unit, and may be selected in accordance with REF fault detection guidance. The pickup setting 402 may be a residual current sensitivity pickup setting. In various embodiments, pickup setting 402 may be selected to be greater than the maximum neutral operate current $IO_{REF}$ 316 and zero-sequence reference current $IR_{REF}$ 312 at steady state. Accordingly, when the negative-sequence reference quantity $IQ_{REF}$ 314 exceeds the pickup setting, comparator 406 asserts to AND gate 410.

A maximum of the operate quantity $IO_{REF}$ 316 and the zero-sequence reference quantity $IR_{REF}$ 312 is compared 408 against the negative-sequence reference quantity $IQ_{REF}$ 314 multiplied by a scaling factor $k_2$ 422. In various embodiments, the scaling factor $k_2$ 422 may be less than one. In one particular embodiment, the scaling factor $k_2$ 422 is 0.1. If the maximum value 404 is greater than the scaled factor of the negative-sequence reference quantity $IQ_{REF}$ 314, then comparator 408 asserts. The assertion of comparator 408 is inverted to AND gate 410. Accordingly, AND gate 410 asserts a security signal 412 upon assertion of comparator 406 and a lack of assertion of comparator 408. In other words, the logic determines a security signal 412 when the negative-sequence reference quantity $IQ_{REF}$ 314 exceeds the pickup setting AND the scaled negative-sequence reference quantity $IQ_{REF}$ 314 is greater than the maximum of the operate quantity $IO_{REF}$ 316 and the zero-sequence reference quantity $IR_{REF}$ 312.

As may become apparent below, an internal fault cannot be determined upon assertion of the security signal 412. Accordingly, presence of excess negative-sequence current reference quantity inhibits the assertion of an internal fault. The security signal 412 indicates negligible ground involvement in the fault.

In essence, FIG. 4 illustrates an embodiment of adding security to REF detection under conditions of insufficient ground involvement. For example, when the zero-sequence reference quantity 312 and the operate quantity 316 are less than around one tenth of the negative-sequence quantity, then an REF element may lose security, and the detection thereof is blocked by assertion of the security signal 412. In one embodiment, REF detection is blocked when the negative-sequence reference signal $IQ_{REF}$ 314 exceeds the pickup setting 402, and both of the zero-sequence reference quantity $IR_{REF}$ 312 and the operate quantity $IO_{REF}$ 316 are less than the scaled 422 (which may be 0.1) negative-sequence reference quantity $IQ_{REF}$ 314.

Figure 5:
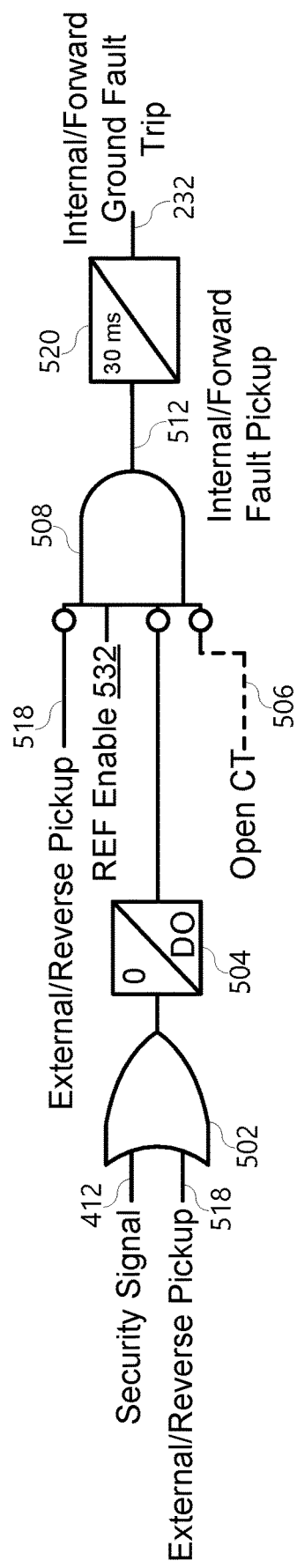
FIG. 5 illustrates a logic diagram for determining an internal fault in accordance with several embodiments herein.

FIG. 5 illustrates a logic diagram that continues the indication of an internal fault 512 and determination of an internal fault 232. That is, the logic may be used to determine a fault within the restricted earth fault zone. In particular, the logic asserts the internal fault pickup signal 512 upon assertion of the REF enable signal 532, and absence of a security signal 412, absence of a reverse fault detection signal 518, and in various embodiments, absence of an open CT detection signal 506. In essence, instead of simply using a forward-fault detection signal to determine an internal fault, the embodiments herein determine an internal fault upon enablement of the REF element and absence of reverse-fault and phase-fault detection. The reverse fault detection signal 518 goes through a security timer 720 (as illustrated and described in conjunction with FIG. 7) and if the condition remains true for 30 ms declares an external, reverse ground fault signal 234.

In the illustrated embodiment, an AND gate 508 receives an inverted reverse fault pickup signal 518, an inverted supervisory signal from timer 504, an REF enable signal 532, and may receive an inverted open CT detection signal 506. It should be noted that in various embodiments, as described below, the open CT detection signal may fall within the REF enable signal 532. In certain embodiments, OR gate 502 may assert to a timer upon assertion of any of the security signal 412 and the reverse fault detection signal 518. Timer 504 may include a pickup setting and a dropout setting. In various embodiments, the pickup may be set to zero such that the timer 504 asserts to AND gate 508 immediately upon assertion of OR gate 502. In various embodiments, the dropout setting may be around 1 second such that the timer 504 remains asserted to AND gate 508 for 1 second after deassertion of the OR gate 502. Because assertion from the timer 504 is inverted to AND gate 508, then assertion of either of the security signal 412 or the reverse fault detection signal 518 will inhibit assertion of the internal fault pickup signal 512 while either of those signals are present and until expiration of the dropout timer 504. The internal fault pickup signal 512 goes through a security timer 520 and if the condition remains true for 30 ms, declares an internal, forward ground fault signal 232.

Accordingly, an internal fault 512 is detected upon assertion of the REF enable signal 532 and in absence of the reverse fault detection signal 518 and the security signal 412. In other words, assertion of the reverse fault detection signal 518 or the security signal 412 may be said to block or inhibit detection of an internal fault 512 by the REF element. Input signals to the logic in FIG. 5 may originate from various logical routines or external inputs. In various embodiments, the reverse fault signal 518, open CT signal 506, and/or the REF enable signal 532 may be determined using the logic described in FIGS. 6 and 7.

Figure 6:
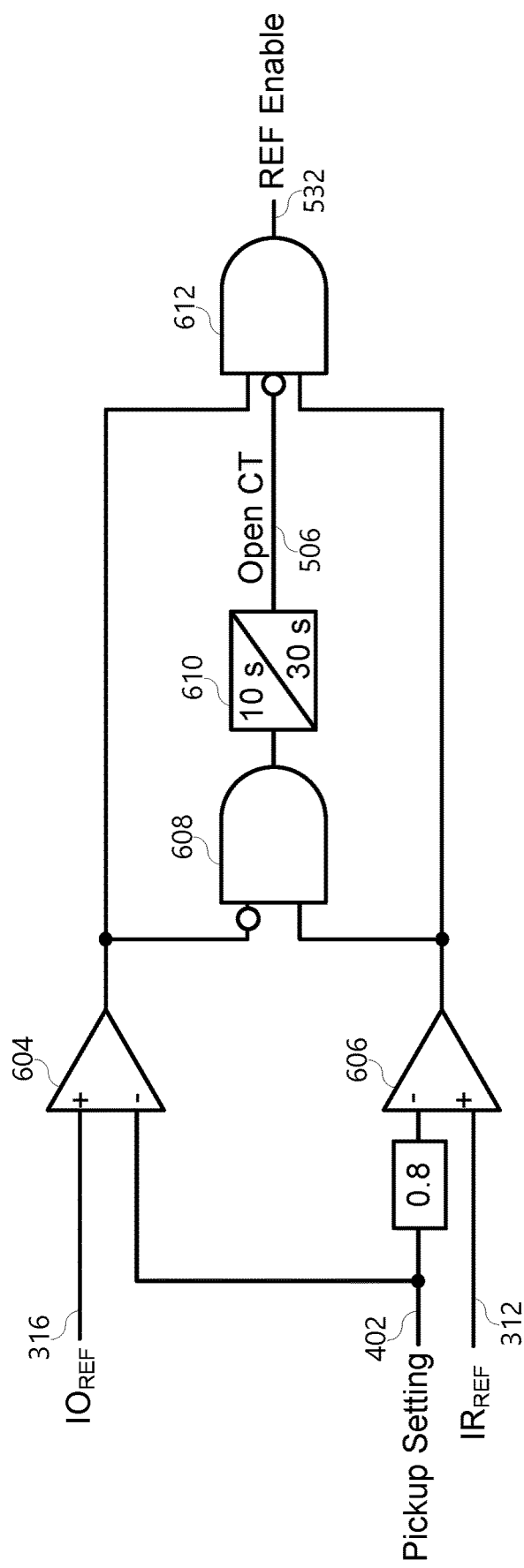
FIG. 6 illustrates a logic diagram used to determine ground fault direction as forward or reverse in accordance with several embodiments herein.

FIG. 6 illustrates a logic diagram useful for determining the REF enable signal 532, and may also be used to provide security for an open CT condition, and open CT signal 506. The logic compares the operate quantity $IO_{REF}$ 316 against the pickup setting 402 in comparator 604; and compares the zero-sequence reference quantity $IR_{REF}$ 312 against a scaled pickup setting 402 in comparator 606. Generally, the REF enable signal 532 is asserted by AND gate 612 when both the operate quantity $IO_{REF}$ 316 exceeds the pickup setting 402 and the zero-sequence reference quantity $IR_{REF}$ 312 exceeds the scaled pickup setting. The pickup setting may be the same as the pickup setting 402 of FIG. 4, or may be an alternative setting.

As can be seen, the open CT signal 506 is asserted based on the comparisons. In particular, when the operate quantity $IO_{REF}$ 316 is not greater than the pickup setting 402 and the zero-sequence reference quantity $IR_{REF}$ 312 does exceed the scaled pickup setting 402, then AND gate 608 asserts to a pickup/dropout timer 610. The timer asserts after a pickup time of assertion of comparators 604 and 606, which may be around 10 seconds, and remains asserted for the dropout time. The dropout time may be around 30 seconds. The timer asserts the open CT signal 506. While the open CT signal 506 is asserted, the REF enable signal is not asserted. That is, when the open CT condition is detected, restricted earth fault detection is not enabled.

The algorithm in FIG. 6 even without the open CT detection portion is inherently secure for an external line-to-ground (LG) fault, where it is expected that a reverse fault would be detected (e.g., by torque comparison, described below) in the absence of CT saturation. Once CT saturation occurs, the saturated CT provides a secondary current with a phase lead lower than 80° with respect to the primary current.

As generally illustrated, the REF enable signal 532 is asserted when sufficient operate and reference current exists. The REF enable signal 532 is asserted when $IO_{REF}$ 316 exceeds the pickup setting 402, and $IR_{REF}$ 312 exceeds a factor (in this case 0.8) of the pickup setting 402. Taken together with FIG. 5, it is evident that an internal or forward ground fault may be determined when there is sufficient operate and reference current (i.e. $IO_{REF}$ 316 exceeds the pickup setting 402, and $IR_{REF}$ 312 exceeds a factor of the pickup setting 402), and an external or reverse fault pickup 518 has not asserted, and the security signal 412 has not asserted.

Figure 7:
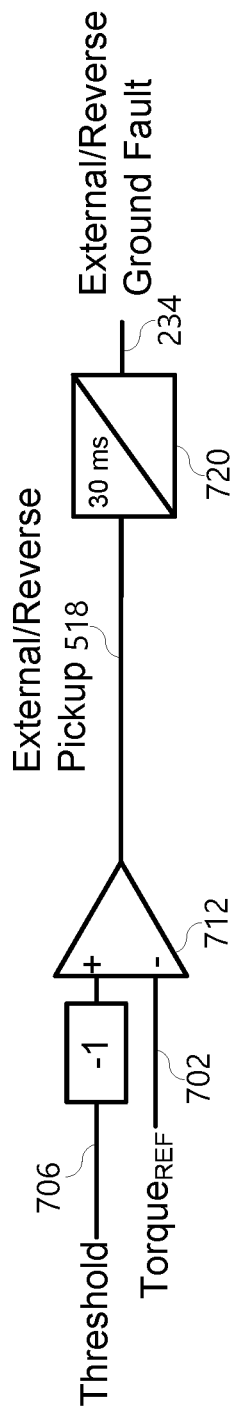
FIG. 7 illustrates a logic diagram for enabling internal fault detection logic in accordance with several embodiments herein.

FIG. 7 illustrates a logic diagram useful for determining a reverse fault signal 518 which may indicate a reverse fault, or fault outside of the restricted earth fault zone. In one embodiment, a restricted earth fault torque signal $Torque_{REF}$ 702 is compared (using, e.g. comparator 712) against a threshold 706. When the torque signal 702 is less than a negative of the threshold 706, then an external/reverse fault pickup signal 518 is asserted by comparator 712. When the torque signal 702 is not less than the negative of the threshold 706, an external/reverse fault pickup signal 518 is not asserted. As mentioned above, in various embodiments the external/reverse fault pickup signal 518 may be secured by a pickup timer 720. Timer 720 may have a pickup time of around 30 ms. Accordingly, upon assertion of the external/reverse fault pickup signal 518 for the pickup time 720, the external/reverse ground fault signal 234 is asserted.

The torque signal 702 may be calculated using the operate quantity $IO_{REF}$ 316 and the zero-sequence reference quantity $IR_{REF}$ 312. In some embodiments, the torque signal 702 may be the real part of the product of the operate quantity $IO_{REF}$ 316 and the zero-sequence reference quantity $IR_{REF}$ 312 as illustrated in Equation 1:

$$Torque_{REF} = Re(IR_{REF} \cdot IO_{REF}) \qquad \text{Eq. 1}$$

The torque threshold 706 may be selected or calculated such that when the angle between the operating current $IO_{REF}$ and the reference current $IR_{REF}$ is within 80° from the ideal 180°, which corresponds to the minimum CT dimensions, a reverse fault pickup 518 is declared.

It should be noted previous REF detection methods checked that the torque signal 702 is greater than the threshold 706 to detect an internal, forward fault. This implied that the forward fault would be detected if due to system non-homogeneity or CT errors, the angle between $IR_{REF}$ 312 and $IO_{REF}$ 316 is within 80°. By using the external, reverse fault indication signal 518 from comparator 712 via the AND gate 508 to declare an internal fault, the angle between $IR_{REF}$ 312 and $IO_{REF}$ 316 need only be within 100°. In low-impedance grounded systems, i.e. when there is a low-impedance resistor that connects transformer winding 112 to ground 128, the angle between the $IR_{REF}$ 312 and $IO_{REF}$ 316 can be close to 90° for an internal ground fault since the contribution from system 140 may be inductive or capacitive. The increase in angle from 80° to 100° provides greater dependability in systems where the transformer winding 112 or a generator stator winding is low-impedance grounded.

The embodiments herein are an improvement to existing restricted earth fault detection by calculating a security signal. The security signal may be calculated using a negative-sequence reference current quantity $IQ_{REF}$ 314 as described herein, and seen in FIG. 4. Embodiments herein are also an improvement to existing restricted earth fault protection by detecting an open CT, and inhibiting the restricted earth fault protection upon detection of the open CT. Accordingly, the present improvements generally detect a fault within the restricted earth fault protection zone of a transformer by calculating a security signal using a negative-sequence reference current quantity $IQ_{REF}$ 314, and an open CT condition. A fault within the restricted earth fault protection zone is detected only in absence of the security signal, absence of the open CT condition, and absence of a reverse fault detection signal. The fault internal to the restricted earth fault protection zone of the transformer may be determined by comparing an operate quantity $IO_{REF}$ 316 and a zero-sequence reference quantity $IR_{REF}$ 312.

Figure 8:
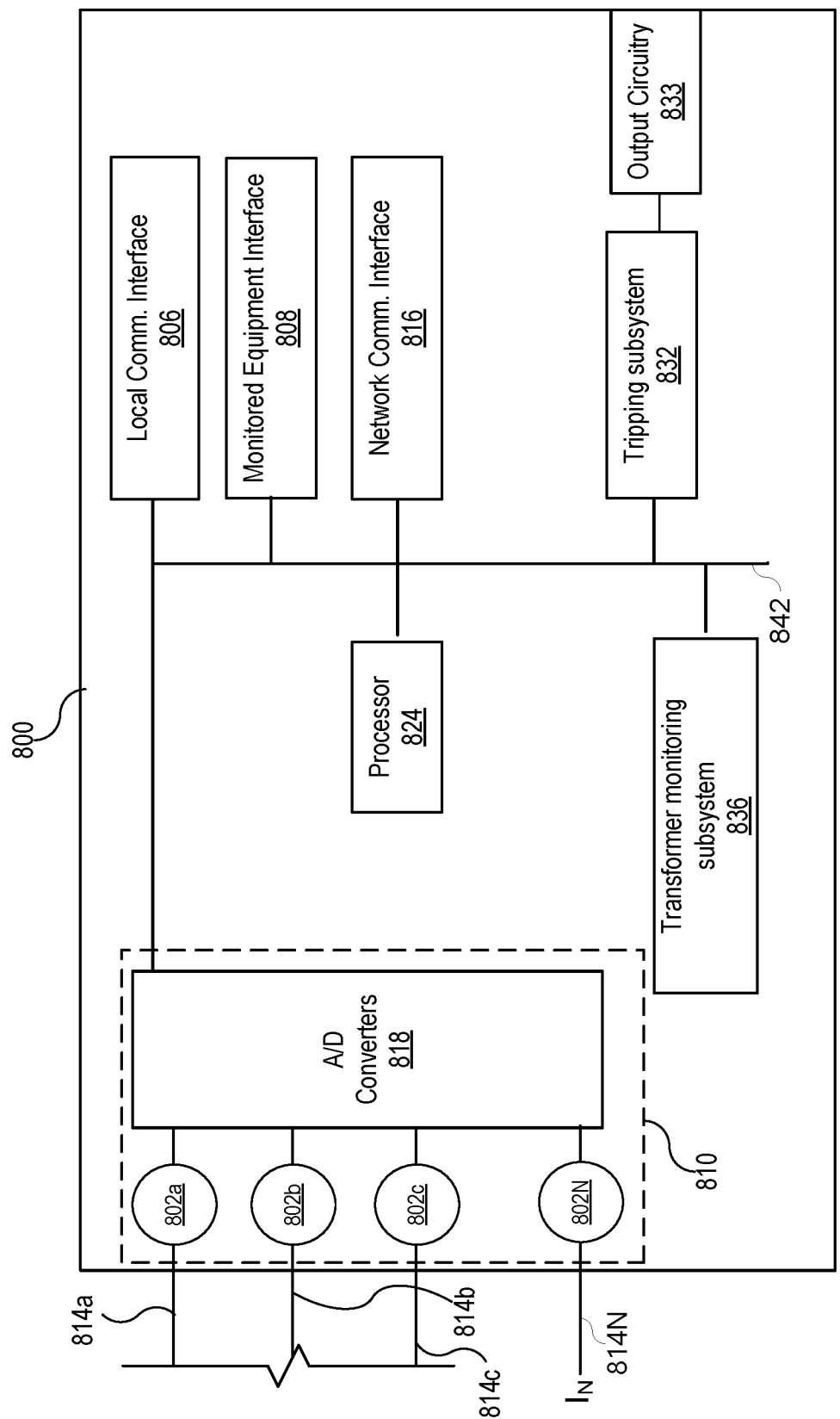
FIG. 8 illustrates a representative simplified diagram of an intelligent electronic device (IED) for determining a fault condition.

FIG. 8 illustrates a simplified block diagram of an IED for securely and rapidly detecting a fault within the restricted earth fault zone of a transformer, and effecting a protective action upon detection. IED 800 may be configured to perform a variety of tasks using a configurable combination of hardware, software, firmware, and/or any combination thereof. The illustrated embodiment includes hardware and software, and may be implemented in an embedded system, field programmable gate array implementations, and specifically designed integrated circuit. In some embodiments, functions described in connection with various software modules may be implemented in various types of hardware. Moreover, certain components or functions described herein may be associated with other devices or performed by other devices. The specifically illustrated configuration is merely representative of one embodiment consistent with the present disclosure.

IED 800 includes a network communications interface 816 configured to communicate with other IEDs and/or system devices. In certain embodiments, the network communications interface 816 may facilitate direct communication with another IED or communicate with another IED over a communications network. The network communications interface 816 may facilitate communications with multiple IEDs. The communications interface 816 may be used to monitor and determine if the communication channel is healthy and/or to determine an order of circuit breakers to trip. Note that any suitable communication network and/or communication channel may be used to communicate voltage data, quality of the communicated information, the biasing factors, or any other suitable data that may be communicated between the generators. Further, any suitable communication protocol to communicate the data may be used, such as Ethernet, Synchrophasor, DB9, peer-to-peer, or a proprietary protocol, among others.

IED 800 may further include a monitored equipment interface 808 to receive status information from, and issue control instructions to, a piece of monitored equipment. In some embodiments, the monitored equipment may be a transformer, a generator, a circuit breaker, or the like, and IED 800 may be configured to control the operation of the transformer, generator, and/or circuit breaker.

A local communication interface 806 may also be provided for local communication. The local communication interface 806 may be embodied in a variety of ways, including as a serial port, a parallel port, a Universal Serial Bus (USB) port, an IEEE 1394 Port, and the like.

In certain embodiments, IED 800 may include a sensor component 810 (e.g., sensor circuitry) to obtain electrical signals related to the transformer. The sensor component 810 may be configured to obtain branch current signals, zero-sequence voltage signals, neutral voltage signals, neutral current signals, or other such signals useful for determining a fault condition of the transformer. In the illustrated embodiment, sensor component 810 is configured to gather data directly from instrument transformers and may use, for example, A/D converters 818 that may sample and/or digitize filtered waveforms to form corresponding digitized current and voltage signals provided to data bus 842. Inputs 814a-c and 814N may be electrically connected to current transformers in electrical communication with portions of a transformer arrangement, such as to the terminals of the transformer (via 814a, 814b, 814c), a neutral-to-ground of the transformer (via 814N) and the like. Conditioning circuitry 812a-c and 802N may reduce the voltage or current to a level appropriate for monitoring the terminator. A/D converters 818 may include a single A/D converter or separate A/D converters for each incoming signal. A current signal may include separate current signals from each phase of a three-phase electric power system. A/D converters 818 may be connected to processor 824 by way of data bus 842, through which representations of electrical signals may be transmitted to processor 824. In various embodiments, the representations of electrical parameters may represent parameters, such as currents, voltages, frequencies, phases, and other parameters associated with an electric power distribution system. Conditioning circuitry 802a-c and 802N may represent a variety of types of elements, such as voltage transformers, current transformers, status inputs, a breaker controller, etc. Sensor component 810 may be configured to receive digitized analog signals from merging units, which need little if any additional filtering, sampling, or processing before use by the processor 824.

Processor 824 may be configured to process communications received via communications interface 816, monitored equipment interface 808, local communications interface 806, and/or sensor component 810. Processor 824 may operate using any number of processing rates and architectures. Processor 824 may be configured to perform various algorithms and calculations described herein. Processor 824 may be embodied as a general-purpose integrated circuit, an application specific integrated circuit, a field-programmable gate array, and/or any other suitable programmable logic device. In some embodiments, the processor 824 may be generally referred to as processing circuitry.

A transformer monitoring subsystem 836 may be configured to monitor the transformer using measured values (currents, voltages, etc.) and/or values received over communications. In particular, the transformer monitoring subsystem 836 may determine restricted earth fault condition in accordance with the several embodiments described herein. The transformer monitoring subsystem 836 may include instructions stored on non-transitory computer-readable storage media that, when executed using a processor, cause the IED to determine a restricted earth fault condition in accordance with the embodiments herein, and effect a protective action such as tripping a circuit breaker upon detection of the restricted earth fault condition.

A tripping subsystem 832 may be configured to issue a trip command based upon determination of the restricted earth fault condition. In various embodiments, the tripping subsystem 832 may be in communication with a breaker, recloser, merging unit, or other device that may be configured to interrupt an electrical connection between the transformer and an electric power delivery system.

In various embodiments, the tripping subsystem 832 may issue trip commands via an electrical or electromechanical interrupter, such as output circuitry 833. In some embodiments, IED 800 may be configured to issue trip commands upon detection of the restricted earth fault condition or other protection elements. In various embodiments the IED 800 may be configured to communicate the determined restricted earth fault condition to other systems, and/or communicate to other systems that a trip command has been issued.

The above description provides numerous specific details for a thorough understanding of the embodiments described herein. However, those of skill in the art will recognize that one or more of the specific details may be omitted, or other methods, components, or materials may be used. In some cases, operations are not shown or described in detail. While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed:

1. A device for protecting equipment of an electric power delivery system, the device comprising;
   a sensor component in electrical communication with an instrument transformer obtaining current signals from a plurality of terminals and a neutral of the equipment, the sensor component including a current signal output for providing current signals corresponding with the terminals and the neutral of the equipment;
   a processor;
   a computer-readable storage medium in communication with the processor and the sensor component, comprising instructions that when executed by the processor cause the device to:
      calculate a zero-sequence reference quantity from the current signals from the plurality of terminals of the equipment;
      calculate a negative-sequence reference quantity from the current signals from the plurality of terminals of the equipment;
      calculate an operate quantity from the current signals from the neutral of the equipment;
      compare the negative-sequence reference quantity to a pickup setting;
      determine a restricted earth fault condition based on the operate quantity and the zero-sequence reference quantity only when the negative-sequence reference quantity does not exceed the pickup setting; and,
      determine a protective action when the restricted earth fault condition is determined; and
   an output in communication with the computer-readable storage medium for effecting the determined protective action.

2. The device of claim 1, wherein the instructions further cause the processor to block determination of the restricted earth fault condition for a predetermined time upon the negative-sequence reference quantity exceeding the pickup setting when the operate quantity and the zero-sequence reference quantity are less than a product of the negative-sequence reference quantity and a scaling factor.

3. The device of claim 1, wherein the instructions further cause the processor to determine the restricted earth fault condition when a product of the negative-sequence reference quantity and a scaling factor is less than a maximum of the operate quantity and the reference quantity.

4. The device of claim 1, wherein the instructions further cause the processor to detect an open current transformer (CT) condition using the reference quantity and the operate quantity.

5. The device of claim 4, wherein the instructions further cause the processor to determine a restricted earth fault condition only when the open CT condition is not detected.

6. The device of claim 4, wherein the open CT condition is detected when the operate quantity is not greater than a pickup setting and the reference quantity is not less than a function of the pickup setting.

7. The device of claim 6, wherein the instructions further cause the processor to enable the determination of the restricted earth fault condition only when:
   the open CT condition is not detected;
   the operate quantity exceeds the pickup setting; and
   the reference quantity does not exceed the function of the pickup setting.

8. The device of claim 1, wherein the instructions further cause the processor to determine the restricted earth fault condition only when a reverse fault is not detected.

9. The device of claim 8, wherein the instructions further cause the processor to:
   calculate a torque using the operate quantity and reference quantity; and
   compare the torque to a threshold to detect the reverse fault.

10. A method of detecting a restricted earth fault condition in an equipment of an electric power delivery system using available electric power signals from terminals and a neutral of the equipment, the method comprising:
    receiving current signals proportional to current in terminals of the equipment;
    receiving neutral current signals proportional to current in a neutral-to-ground of the equipment;
    calculating an operate quantity using the neutral current signals;
    calculating a reference quantity using the current signals proportional to the current in the terminals;
    calculating a negative-sequence reference quantity using the current signals proportional to the current in the terminals;
    calculating a torque signal using the operate quantity and the reference quantity;
    determining a direction of a fault as reverse using the torque signal and a torque threshold;
    comparing the negative-sequence reference quantity to a pickup setting;
    detecting a restricted earth fault condition upon a determination that the direction of the fault is not reverse, the operate quantity and zero-sequence reference quantity are greater than the pickup setting and the negative-sequence reference quantity is greater than the pickup; and
    effecting a protective action upon determination of the restricted earth fault condition.

11. The method of claim 10, further comprising comparing the negative-sequence reference quantity to a product of the pickup setting and a factor.

12. The method of claim 11, further comprising detecting the restricted earth fault condition only when the negative-sequence reference quantity is less than the product of the pickup setting and the factor.

13. The method of claim 10, further comprising determining an open CT condition, and wherein the restricted earth fault condition is detected only when no open CT condition is determined.

14. The method of claim 10, wherein the open CT condition is determined when the operate quantity does not exceed the pickup setting and the reference quantity is not less than a function of the pickup setting for a pickup time.

15. The method of claim 10, wherein determining the direction of a fault comprises:
    determining the reverse direction when the torque signal is less than a negative of the torque threshold.

16. A system for detecting a restricted earth fault in equipment of an electric power delivery system, comprising:
    a sensor component in electrical communication with an instrument transformer obtaining current signals from a plurality of terminals and a neutral of the equipment, the sensor component including a current signal output for providing current signals corresponding with the terminals and the neutral of the equipment;
    a monitoring subsystem configured to:
        calculate a reference quantity from the current signals from the plurality of terminals of the equipment;
        calculate a negative-sequence reference quantity from the current signals from the plurality of terminals of the equipment;
        calculate an operate quantity from the current signals from the neutral of the equipment;
        compare the negative-sequence reference quantity to a pickup setting;
        determine a restricted earth fault condition based upon the operate quantity and the zero-sequence reference quantity only when the negative-sequence reference quantity does not exceed the pickup setting; and,
        determine a protective action when the restricted earth fault condition is determined; and
    a tripping subsystem in communication with the monitoring subsystem for effecting the determined protective action.

17. The system of claim 16, wherein the restricted earth fault condition is determined when a product of the negative-sequence reference quantity and a scaling factor is less the operate quantity and the reference quantity.

18. The system of claim 16, wherein the transformer monitoring subsystem is further configured to detect an open CT condition using the reference quantity and the operate quantity.

19. The device of claim 18, wherein the transformer monitoring subsystem is further configured to determine a restricted earth fault condition only when the open CT condition is not detected.

20. The device of claim 16, wherein the monitoring subsystem is further configured to determine the restricted earth fault condition only when a reverse fault is not detected.

* * * * *